(12) United States Patent
Waldvogel et al.

(10) Patent No.: US 7,195,145 B2
(45) Date of Patent: *Mar. 27, 2007

(54) ELECTRICAL CIRCUIT APPARATUS AND METHOD FOR ASSEMBLING SAME

(75) Inventors: John M. Waldvogel, Libertyville, IL (US); Herman J. Miller, Algonquin, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/180,188

(22) Filed: Jul. 13, 2005

(65) Prior Publication Data

US 2007/0012751 A1  Jan. 18, 2007

(51) Int. Cl.
- *B23K 31/02* (2006.01)
- *B21D 39/00* (2006.01)
- *H01L 23/10* (2006.01)
- *H01L 23/34* (2006.01)

(52) U.S. Cl. .................... 228/256; 228/49.1; 228/120; 228/174; 228/179.1; 257/706; 257/707

(58) Field of Classification Search ............... 228/256, 228/49.1, 120, 174, 179.1; 257/706, 707
See application file for complete search history.

(56) References Cited

U.S. PATENT DOCUMENTS

| | | | |
|---|---|---|---|
| 4,030,001 A | 6/1977 | Medley et al. | |
| 5,646,444 A * | 7/1997 | Bartlett et al. | ............... 257/706 |
| 6,011,692 A | 1/2000 | Bergstedt et al. | |
| 6,027,590 A * | 2/2000 | Sylvester et al. | ........... 156/150 |
| 6,449,158 B1 | 9/2002 | Wang et al. | |
| 6,537,857 B2 | 3/2003 | Aquien et al. | |
| 6,635,958 B2 | 10/2003 | Bates et al. | |
| 6,770,967 B2 | 8/2004 | Barcley | |
| 6,842,341 B1 * | 1/2005 | Waldvogel et al. | ......... 361/704 |
| 6,861,746 B1 * | 3/2005 | Waldvogel et al. | ......... 257/706 |
| 7,063,249 B2 * | 6/2006 | Waldvogel et al. | ...... 228/180.1 |
| 7,070,084 B2 * | 7/2006 | Waldvogel et al. | ...... 228/180.1 |
| 2001/0004944 A1 * | 6/2001 | Nakamura et al. | .......... 174/262 |
| 2005/0092814 A1 * | 5/2005 | Waldvogel et al. | ...... 228/180.1 |
| 2005/0121774 A1 * | 6/2005 | Waldvogel et al. | ......... 257/706 |

* cited by examiner

*Primary Examiner*—Jonathan Johnson
*Assistant Examiner*—Rachel E. Beveridge

(57) ABSTRACT

A method for assembling an electrical circuit apparatus that includes; a substrate having a top side, a ground layer, at least one thermal aperture, and at least one solder aperture; a heat sink; and an adhesive layer for mechanically coupling the heat sink to the ground layer of the substrate, the adhesive layer having at least one aperture wherein aligning the at least one substrate solder aperture with the at least one adhesive layer aperture enables solder wetting in a predetermined area between the heat sink and the ground layer of the substrate.

8 Claims, 5 Drawing Sheets

ELECTRICAL CIRCUIT APPARATUS AND METHOD FOR ASSEMBLING SAME

CROSS-REFERENCE TO RELATED APPLICATIONS

The present application is related to the following U.S. applications commonly owned together with this application by Motorola, Inc.:

Ser. No. 11/000,697, filed Oct. 2, 2003, titled "Electrical Circuit Apparatus and Method for Assembling Same" by Waldvogel, et al.; and Ser. No. 11/031,224, filed Oct. 2, 2003, titled "Electrical Circuit Apparatus and Method for Assembling Same" by Waldvogel, et al.

FIELD OF THE INVENTION

The present invention relates generally to a method and electrical circuit apparatus, wherein components are mounted to a circuit board, and have a lower coefficient of thermal expansion than the heat sink to which they are coupled.

BACKGROUND OF THE INVENTION

When constructing power amplifiers various components or devices (wherein the terms component and device is used interchangeably herein) must be mounted to a circuit board or substrate. Many of these components are mounted to a top side of the circuit board using a known solder reflow process. For instance, a load resistor having at least one input terminal and having a ground portion (also referred to herein as a ground flange or a ground terminal, wherein these terms may be used interchangeably) may be mounted to the top side of the circuit board. When mounting a load resistor to a circuit board, three factors must be balanced. First, the load resistor must have a proper and sufficient electrical connection to the circuit board, wherein the input terminals are soldered to the top side of the circuit board and the ground terminal is sufficiently coupled to a heat sink that is typically soldered locally to the underside of the circuit board in an area primarily surrounding the load resistor. In addition, a sufficient thermal conduction path must be established between the load resistor and the heat sink. Moreover, load resistors are typically made of a ceramic material, which presents a thermal expansion mismatch between the load resistor and the heat sink since the heat sink typically has a higher coefficient of thermal expansion (CTE) than the ceramic load resistor. This CTE mismatch can result in local distortion or warping of the circuit board after assembly. Solder joint reliability can also be significantly degraded in a thermal cycling application.

There are a number of methods used for mounting devices such as load resistors to a circuit board, including a hybrid manufacturing process using fixtures (i.e., a one pass solder reflow process) and a two pass solder reflow process. The hybrid manufacturing process is typically associated with ceramic circuit boards and possibly with carrier plates that serve as heat sinks. Due to the fragility of the substrate, large fixtures are usually required for its alignment and protection during processing. The use of fixtures usually forces manual processing.

One disadvantage of the hybrid manufacturing process is that it is more costly than other manufacturing methods primarily due to the added cost of the fixtures used in the process and also due to the need for a number of manual steps that generate a lower production throughput. An additional disadvantage is that manufacturing with fixtures produces a significant variation in part placement and solder attachment due to fixture tolerances or due to fixture degradation with repeated use.

Turning now to the two pass solder reflow process. During the first pass of the solder reflow process, a plurality of heat sinks are locally coupled to the ground layer of a circuit board in areas primarily surrounding where power components will be mounted. Thereafter, solder is placed in strategic areas on the board, and a plurality of components, including, load resistors, are mounted onto and soldered to the board in a second pass of the reflow solder process.

A primary disadvantage of the two pass reflow process is that it requires one high-temperature reflow pass with a high melting temperature solder alloy, and a second subsequent reflow pass with a lower melting temperature solder allow. The first pass exposes the circuit board to high temperature, which can result in damage such as distortion. The requirement of two independent passes with different solder temperature settings limits manufacturing throughput. The two pass approach also does not lend itself well to no-lead solder because the first temperature needed to attach the heat sinks would have to exceed the elevated no-lead solder reflow temperature. This is a significant disadvantage because no-lead solder attachment may likely become a key product differentiator in the near future since some markets, especially European markets, are moving toward requiring no-lead solder attachment.

In addition, neither the hybrid manufacturing process nor the two pass solder reflow process addresses the thermal expansion mismatch issues that arise when mounting devices such as ceramic load resistors to a circuit board.

Thus, there exists a need for a cost effective method and electrical circuit apparatus wherein: components may be mounted to a circuit board without the need for fixtures; the process for assembling the electrical circuit apparatus is compatible with a single pass solder reflow process that is compatible with, but is not limited to no-lead solder; and any thermal expansion mismatch problems in the electrical circuit apparatus are addressed and, when possible, minimized.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE INVENTION

Figure 1:
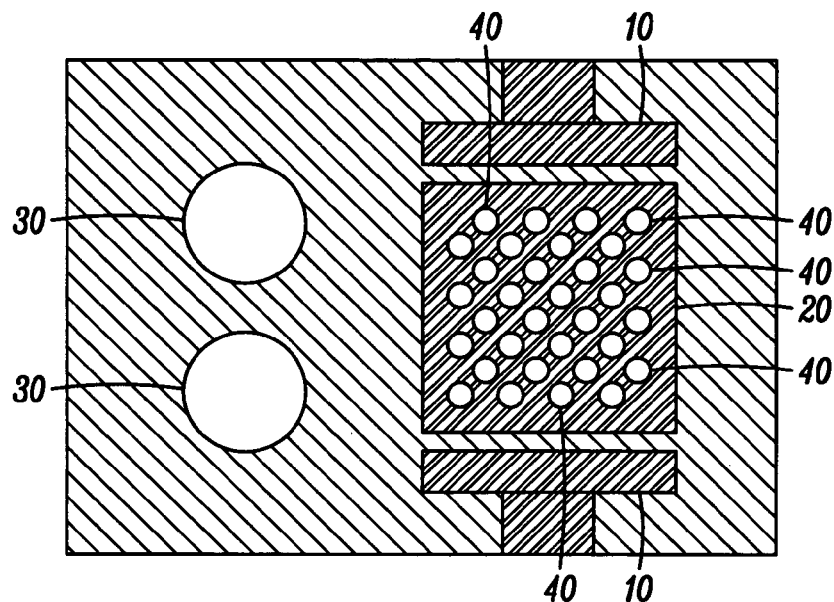
FIG. 1 illustrates a topside view of a schematic diagram of a portion of a substrate in accordance with embodiments of the present invention.

Before describing in detail embodiments that are in accordance with the present invention, it should be observed that the embodiments reside primarily in combinations of method steps and apparatus components related to a method and apparatus for an electrical circuit assembly. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Generally speaking, pursuant to the various embodiments, an electrical circuit apparatus that includes a component having a lower CTE than that of a heat sink coupled to the component and a method for assembling the electrical apparatus is described. To minimize thermal expansion mismatch problems, the component and the heat sink are sufficiently mechanically de-coupled by creating a ground plane-to-heat sink solder connection in locations that are near but not directly beneath the ground terminal of the component. Those skilled in the art will realize that the above recognized advantages and other advantages described herein are merely exemplary and are not meant to be a complete rendering of all of the advantages of the various embodiments of the present invention.

Referring now to the drawings, and in particular FIG. 1, a topside view of a schematic diagram of a portion of a circuit board or substrate in accordance with embodiments of the present invention is shown and generally indicated at 100. In one embodiment, substrate 100 is an organic circuit board such as a printed circuit board (PCB). However, those of ordinary skill in the art will realize that other substrates (ceramic, for example) may be incorporated. Substrate 100 includes a ground layer (not shown), which may comprise a bottom side of the substrate or may, alternatively, exist internal to the top side and the bottom side of the substrate. The ground layer is typically comprised of copper, which may be coated or plated with a variety of protective layers (e.g., organic surface coating, tin, nickel or gold).

Substrate 100 may include pads 10 and 20 for enabling a component to be mounted on the topside of substrate 100. For instance, where a load resistor having at least one input terminal and a ground terminal is being mounted to substrate 100, the input terminals may be coupled to the substrate at pads 10, and the ground terminal may be coupled to the substrate at pad 20.

Substrate 100 further includes at least one but typically a plurality of thermal apertures (commonly referred to as thermal vias) 40 that are electrically and thermally conducting cut-outs extending through the substrate, for instance through pad 20, and by which a component may be both electrically and thermally coupled to a heat sink below for grounding of the component and for heat dissipation of the component. In one embodiment, a device such as a load resistor may be coupled to the heat sink via thermal apertures 40. However, it is appreciated that the device may be any device that is mounted in one region of the substrate, e.g., the top side of the substrate, but that can also be coupled to the heat sink below the substrate such as, for instance, surface mount transistors or chip capacitors.

Substrate 100 further includes solder apertures 30 that are cut-outs extending through the substrate for accommodating solder addition prior to solder wetting. Solder wetting is defined as the flow of molten solder due to surface tension forces along a surface or multiple surfaces away from the initial area of solder addition. The solder may be in the form of paste, pellets, etc., and may be leaded or no-lead solder. The placement, size and shape of the solder apertures 30 are predetermined and assist in causing solder wetting in a predetermined area, for instance, between a heat sink and the ground layer of the substrate 100. FIG. 1 illustrates two circular shaped solder apertures 30. The placement, size and shape of solder apertures 30 are exemplary for optimal solder wetting beneath a load resistor. However, those of ordinary skill in the art will realize that depending upon the particular component being mounted and the desired area for solder wetting, there may be more or fewer solder apertures in other locations on the substrate and having other sizes and shapes.

Figure 2:
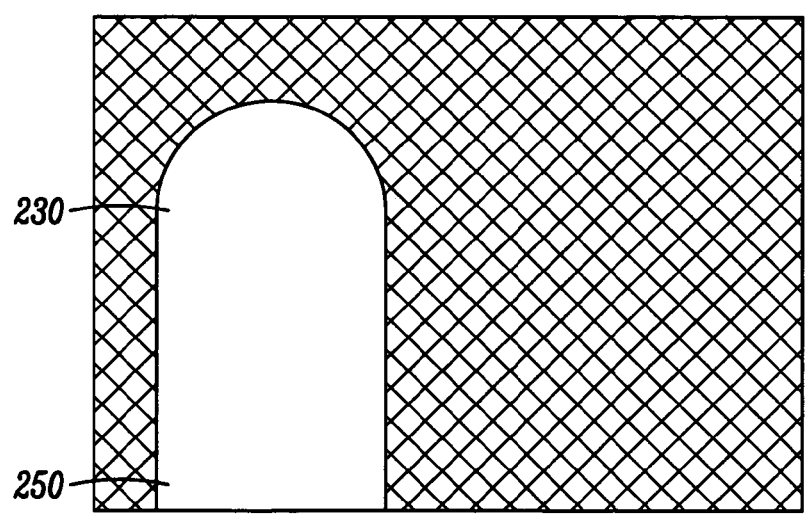
FIG. 2 illustrates a topside view of a schematic diagram of an adhesive layer in accordance with embodiments of the present invention.

Turning now to FIG. 2, a topside view of a schematic diagram of an adhesive layer in accordance with embodiments of the present invention is shown and generally indicated at 200. Adhesive layer 200 corresponds to substrate portion 100 of FIG. 1 and is used for mechanically coupling at least a portion of one heat sink to the ground layer of substrate 100.

Adhesive layer 200 is typically comprised of a flexible material with adhesive and cohesive properties that are stable over the high temperature of the reflow soldering process. The material is typically electrically non-conducting but may also be a conducting material. In one embodiment, the material is a flexible, pressure sensitive acrylic adhesive. In another embodiment, a flexible liquid or film adhesive requiring a curing process (e.g., elevated temperature) may be used. Adhesive layer 200 may be manufactured having a predetermined thickness, the purpose of which will be discussed below.

Adhesive layer 200 includes at least one aperture 230 that is located in an area that is not beneath at least the ground portion of one or more devices—having a first CTE—that are mounted on top of substrate 100. This enables a sufficient mechanical de-coupling between the device(s) and a heat sink coupled below the device(s) that has a higher CTE than the first CTE, thereby, addressing thermal expansion mismatch problems. In one embodiment, aperture(s) 230 may be located in an area that is not beneath any portion of the body of a corresponding device, such as a load resistor. However in other embodiments, aperture(s) 230 may extend beneath the device in areas other than beneath the ground terminal such as, for instance, beneath all or a portion of one or more of the input terminals.

Aperture 230 is likewise a cut-out that extends through the adhesive layer and that has a size and dimensions that enables sufficient thermal coupling between one or more devices and the heat sink but that provides mechanical isolation between the devices with a lower CTE than the heat sink. Aperture 230 thus functions as both a solder aperture for accommodating solder prior to solder wetting and a thermal aperture for providing thermal coupling between one or more devices and a heat sink subsequent to the solder wetting. At least one venting feature or aperture 250, may be added in conjunction with aperture 230. Venting feature 250 is typically located on a predetermined area of the adhesive layer 200 for enabling solder volatiles to escape for optimal solder wetting. In this embodiment, venting feature 250 is an extension of aperture 230 to an edge of adhesive layer 200.

The placement, size and shape of aperture(s) 230 is predetermined so that the aligning of solder apertures 30 with aperture(s) 230 provides for a precise cavity for guiding and controlling solder wetting from the apertures (30,230) to a predetermined area, for instance, between a heat sink and the ground layer of substrate 100. However, the venting feature 250 has no corresponding aperture in the substrate and functions to permit volatiles trapped within solder to escape during solder wetting. As such, the venting features typically extend to the edge of the heat sink after attachment. In the embodiment illustrated in FIG. 2, there is only one venting feature 250 illustrated, and it is located adjacent to the adhesive layer aperture 230. However, it is appreciated that additional venting features may be used. Moreover, the size, dimension, number and placement of the venting features may be determined, for instance, as a function of the desired solder wetting between the substrate ground layer and the heat sink and as a function of the edge of the heat sink relative to the aperture 230. The venting feature in this embodiment is an aperture through the adhesive layer, but it is understood that the venting feature may be one or more holes in the substrate. The adhesive layer may, thus, be die-cut from an adhesive film or adhesive coated film for repeatability in producing the desired thickness and shape of the adhesive layer.

Figure 3:
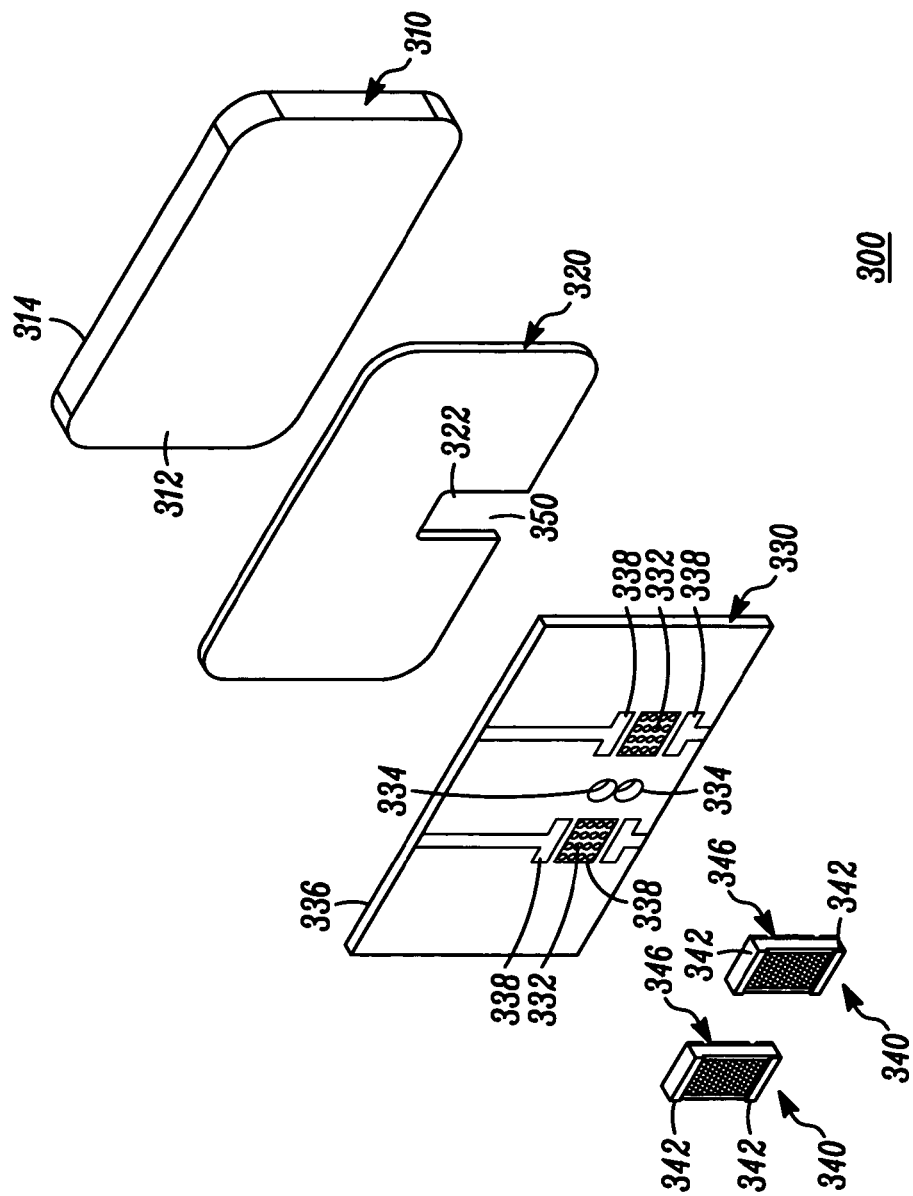
FIG. 3 illustrates an exploded view of electrical circuit apparatus including a heat sink, an adhesive layer, a substrate, and components in accordance with embodiments of the present invention.

Turning now to FIG. 3 an exploded view of electrical circuit apparatus in accordance with embodiments of the present invention is shown and generally indicated at 300. Circuit apparatus 300 includes a heat sink 310, an adhesive layer 320, a substrate portion 330, and one or more (in this illustration two) devices 340. Heat sink 310 may be comprised of a suitable high thermal conductive material such as, for instance, copper or aluminum, that allows wetting of solder and attachment of adhesive materials selected for the circuit apparatus assembly process. Heat sink 310 has two primary sides 312 and 314. At side 312, substrate portion 330 is attached using adhesive layer 320 and coupled using solder, and heat is input into heat sink 310 for dissipation. The opposite side 314 is the primary region of heat extraction from circuit apparatus 300, as well as the primary mounting surface for circuit apparatus 300. In one embodiment, the size of the heat sink is larger than the area of the heat dissipating device(s) (e.g., devices 340), such that desirable heat spreading can be achieved.

Adhesive layer 320 is in accordance with the adhesive layer as described by reference to FIG. 2. Accordingly, adhesive layer 320 includes an aperture 322 and a venting feature 350. Substrate portion 330 is in accordance with the substrate portion as described by reference to FIG. 1. Accordingly, substrate portion 330 includes thermal apertures 332, solder apertures 334, and a ground layer 336. Substrate 330 also typically includes a plurality of pads 338 on the topside of the substrate onto which the devices 340 may be coupled and through which the substrate thermal apertures may extend. In the embodiment illustrated in FIG. 3, ground layer 336 comprises the bottom side of substrate 330. However, it is realized that ground layer 336 may be internal to substrate 330, wherein substrate 330 would further include a recess for exposing the ground layer, the recess typically having dimensions that are slightly larger than that of heat sink 310.

Finally, device 340 may comprise at least one input terminal 342 and a ground portion or terminal 346. In one embodiment, device 340 is a load resistor. However, it is appreciated that device 340 may also be any device that is mounted on the top side of the substrate portion 330 and that has a lower CTE than the heat sink 310. It is also appreciated that the load resistor is typically a ceramic device consisting of materials such as aluminum oxide, beryllium oxide or aluminum nitride having a low CTE, typically in the range 4 to 9 ppm/° C. Whereas, the CTE of the heat sink may be in the range of 17 to 24 ppm/° C.

Figure 4:
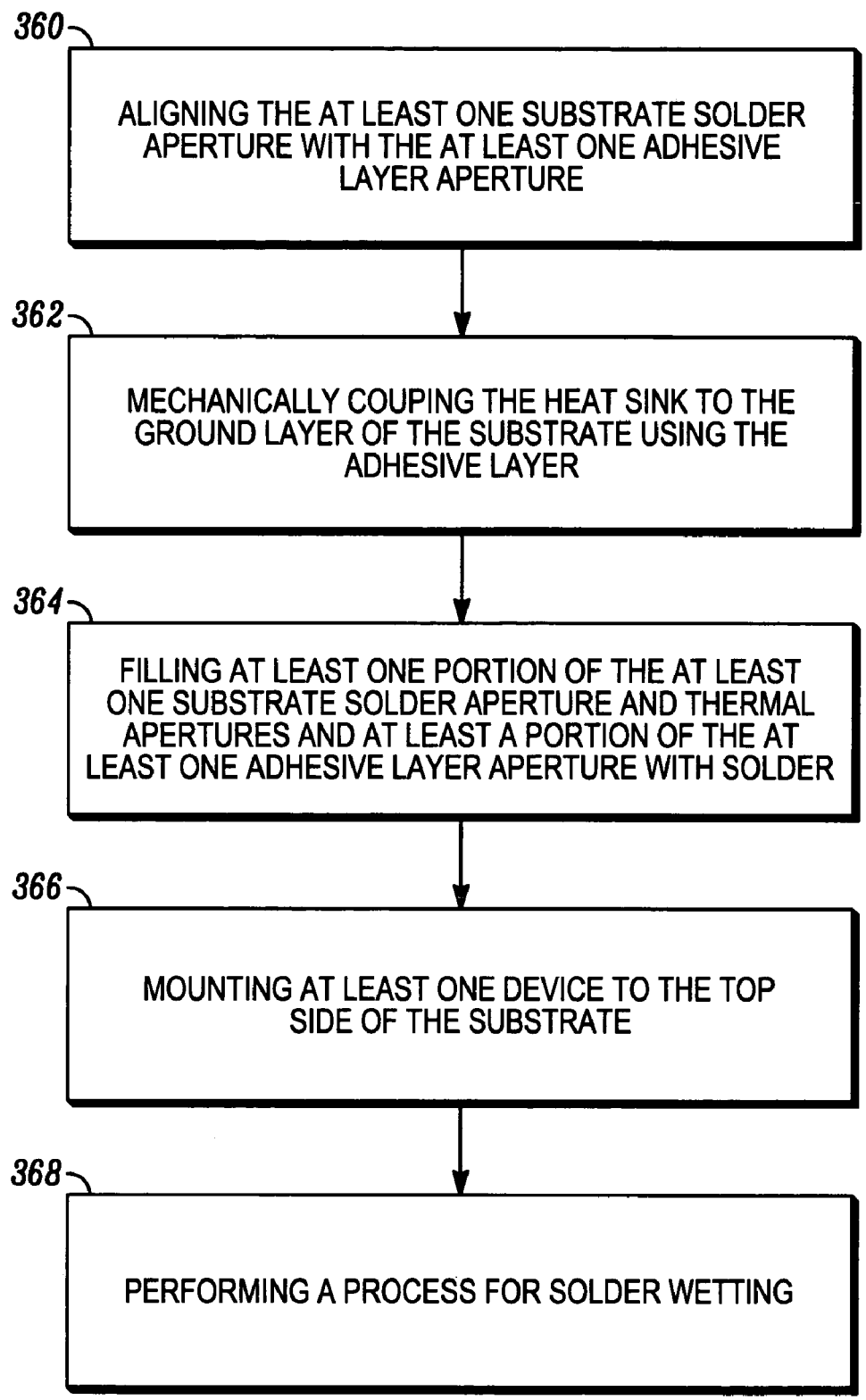
FIG. 4 illustrates a flow diagram of a method for assembling an electrical circuit apparatus in accordance with embodiments of the present invention.

The above-described elements of circuit apparatus 300 may be assembled as follows in accordance with embodiments herein, as illustrated by reference to FIG. 4. Adhesive layer 320 is aligned (360) with substrate 330 such that adhesive layer aperture 322 is aligned with substrate solder apertures 334. Heat sink 310 is mechanically coupled (362) to the ground layer 336 of substrate 330 using adhesive layer 320, such that none of thermal apertures 332 overlap adhesive layer aperture. In the embodiment illustrated in FIG. 3, heat sink 310 is coupled locally to substrate 330 in an area that completely surrounds device 340 for providing an optimal thermal conduction path.

Solder is placed (364) on the substrate pads 338 (and thereby on at least a portion of the substrate thermal apertures 332), and into at least a portion of the substrate solder apertures 334 for subsequent solder wetting to couple the device input terminals 342 to the substrate pads and to couple the device ground terminal 346 to the ground layer 336 of the substrate and the heat sink 310, thereby grounding the device 340. Typically, solder paste is screen-printed on the substrate pads and into the solder apertures 334. However, in other embodiments, other forms of solder, e.g., solder pellets or pre-forms, may be implemented. It is further appreciated that during solder addition, solder may also be added to at least a portion of the adhesive aperture 322. In fact, typically both the substrate solder apertures 334 and at least a portion of the adhesive layer aperture 322 are filled (364) during solder addition.

The devices 340 are mounted (366) onto the topside of substrate 330 such that at least one input terminal 342 comes into contact with the solder on the corresponding pad on the topside of substrate 330 and at least a portion of the device ground terminal 346 covers at least a portion of substrate thermal apertures 332. Population of the substrate 330 with the devices 340 may be done manually, but is typically done using an automated process for efficiency and cost effectiveness during the manufacturing process. The populated substrate 330 may then undergo a process for solder wetting (368). For example, the populated substrate 330 may be placed in a reflow oven and thereafter cooled, wherein: a solder connection between the device inputs terminal 342 and the corresponding substrate pad is completed; solder wets through a least a portion of the substrate thermal apertures 332 to the ground layer 336 to complete the grounding of devices 340; and solder wets from the solder apertures 334 and the adhesive layer aperture 324 into the cavity between the ground layer 336 and the heat sink 310 to complete the grounding and thermal coupling of devices 340, while creating a sufficient mechanical isolation or de-coupling between the devices 340 and the heat sink 310.

In one embodiment, at least a portion of the steps of the method according to the present invention described above may be performed as part of an automated process, and ideally all of the steps are so performed. However, it is realized that any of the above described steps in various combinations may be performed manually or as part of an automated process.

Mechanical attachment of the heat sink to the substrate prior to reflow eliminates the need for fixtures to hold the heat sink in place during a surface mount technology (SMT) processing and adds robustness during the assembly process for handling of the circuit apparatus assembly. Assembly of the electrical circuit apparatus may be performed during a single pass reflow process for the thermal coupling and device grounding and topside SMT attachment, thereby lending itself well with the use of no-lead solder or leaded solder.

The substrate layer solder apertures, the adhesive layer aperture, the substrate ground layer and the wettable heat sink surface promote wetting of solder from the solder apertures to areas of critical thermal transfer and RF grounding during reflow. High surface energy surfaces above (substrate ground layer) and below (heat sink) promote the wetting of solder to the open space between the two wettable surfaces. These surfaces also provide ideal adhesive bonding surfaces yielding high adhesion strength between the heat sink and the substrate. During solder addition, solder fills many of the substrate thermal apertures, which improves RF grounding and the thermal conduction path from the device to the heat sink via the ground layer of the substrate.

Use of a film adhesive with controlled thickness produces a highly repeatable separation, resulting in lower variation of this critical dimension for the manufacturing process. A venting feature may be created by extending the adhesive cut-out to the edge of the circuit board or through at least one venting hole formed in the circuit board. This venting feature further promotes optimal solder filling in the separation by allowing solder paste volatiles to escape. The size and shape of the solder apertures for the paste also defines the volume of molten solder to fill the separation and is easily controlled to optimize thermal coupling and RF grounding. The combination of this control of solder volume and the termination of the region of two high surface energy surfaces created by the cut-outs in the adhesive restricts the flow of molten solder to the region of interest. The resulting ground layer-to-heat sink solder connection produces repeatable thermal and RF ground paths from the load resistor to the heat sink, wherein the ground paths are isolated from being directly beneath the ground terminal of the device for optimal electrical performance and minimization of thermal expansion mismatch problems.

Since the bulk of the attachment of the heat sink to the substrate is accomplished using a low-stiffness adhesive, thermal expansion differences between the heat sink and components on top of the substrate (e.g., ceramic components, such as RF load resistors, that have a much lower coefficient of thermal expansion than the heat sink) are mechanically decoupled, thus improving the reliability of the components and corresponding solder joints. Moreover, the thermal apertures enable a good thermal conduction path between the ground terminal of the device and the heat sink.

FIG. 3, for simplicity, illustrates a portion of a substrate having two components mounted thereon using methods described above in accordance with embodiments of the present invention. However, those of ordinary skill in the art will realize that a substrate that has fewer or more components can be manufactured without departing from the scope of the teachings herein. Those of ordinary skill in the art will further realize that although FIG. 3 illustrates heat sink 310 being coupled locally to substrate 330 beneath only two devices 340, typically heat sink 310 is coupled locally beneath additional devices for efficiency in manufacturing and to minimize manufacturing costs. In addition, FIG. 3 only shows one heat sink being coupled to substrate 330. However, it is appreciated that a plurality of heat sinks may be coupled to the substrate.

Figure 5:
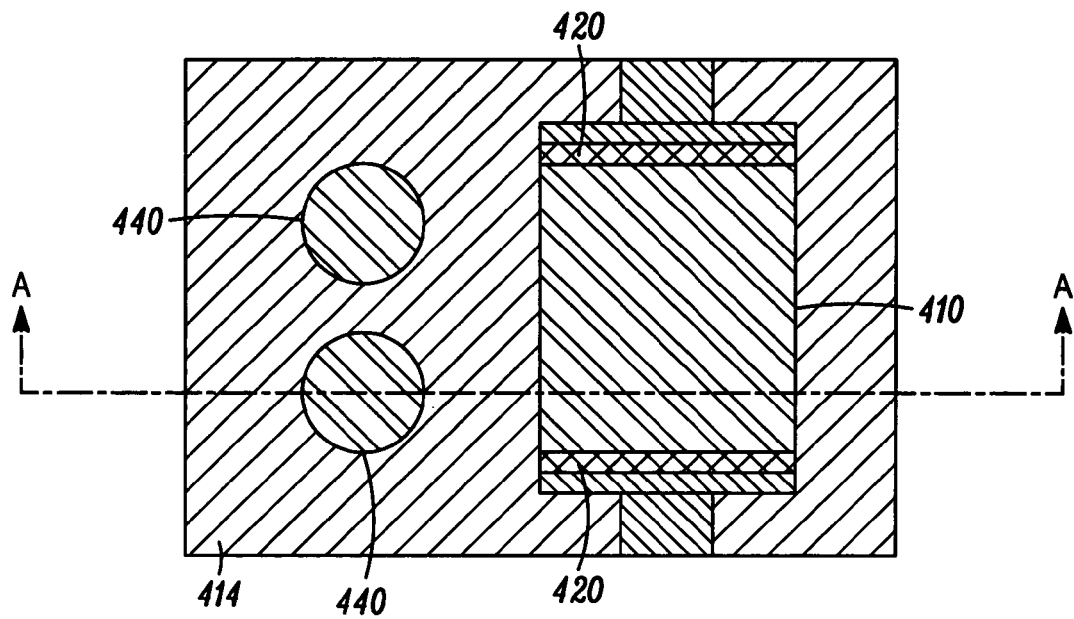
FIG. 5 illustrates an assembled topside view of electrical circuit apparatus in accordance with embodiments of the present invention.

Turning now to FIG. 5, an assembled topside view of an electrical circuit apparatus in accordance with the electrical circuit apparatus illustrated in FIG. 3, subsequent to a solder paste screening and device population but prior to solder wetting is shown and generally indicated at 400. Illustrated in FIG. 5 is the topside of a device 410 that has been mounted onto a substrate 414, wherein the device input terminals 420 have made contact with the solder on a pad (not shown) on the top side of the substrate 414, and a ground terminal (not shown) has made contact with solder on another substrate pad (not shown) on the topside of the substrate 414. Also illustrated are two solder apertures 440 that have been filled with solder using known methods, and a cross-section line labeled A—A illustrates a cross-sectional area of the electrical circuit apparatus 400 that will be discussed in detail by reference to FIGS. 6 and 7.

Figure 6:
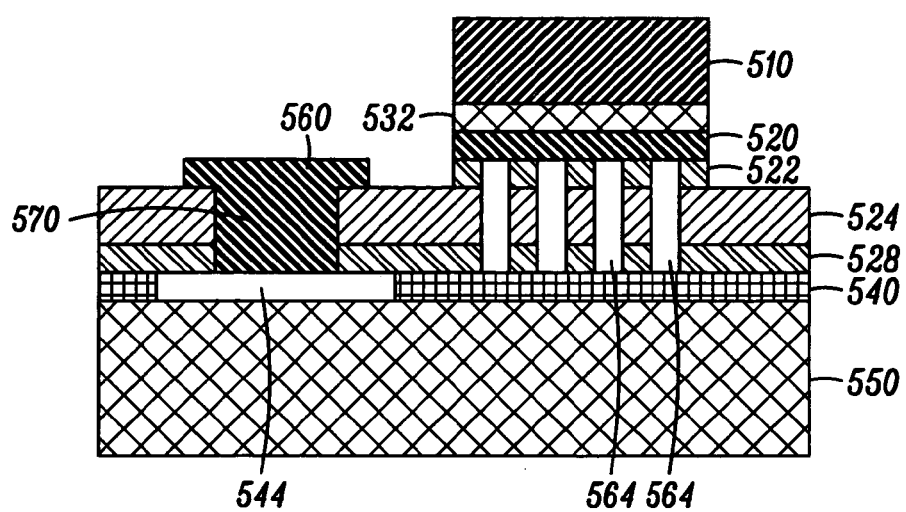
FIG. 6 illustrates a cross-sectional view at a section A—A of the electrical circuit apparatus illustrated in FIG. 5 prior to solder wetting.

FIG. 6 illustrates a cross-sectional view at a section A—A of the electrical circuit apparatus 400 illustrated in FIG. 5 prior to solder wetting. This cross-sectional view illustrates a device 510 having at least one input terminal (not shown) and a ground terminal 532 coupled to pad 522 on a substrate 524 via a solder layer 520. At least a portion of ground terminal 532 is mounted over a plurality of thermal apertures 564 that extend through substrate 524. A ground layer 528 of substrate 524 is mechanically coupled to a heat sink 550 via an adhesive layer 540, wherein the adhesive layer 540 creates a precise cavity 544 between the ground layer 528 and heat sink 550. Further illustrated is solder 560 that has been added using known methods into a solder aperture 570.

Figure 7:
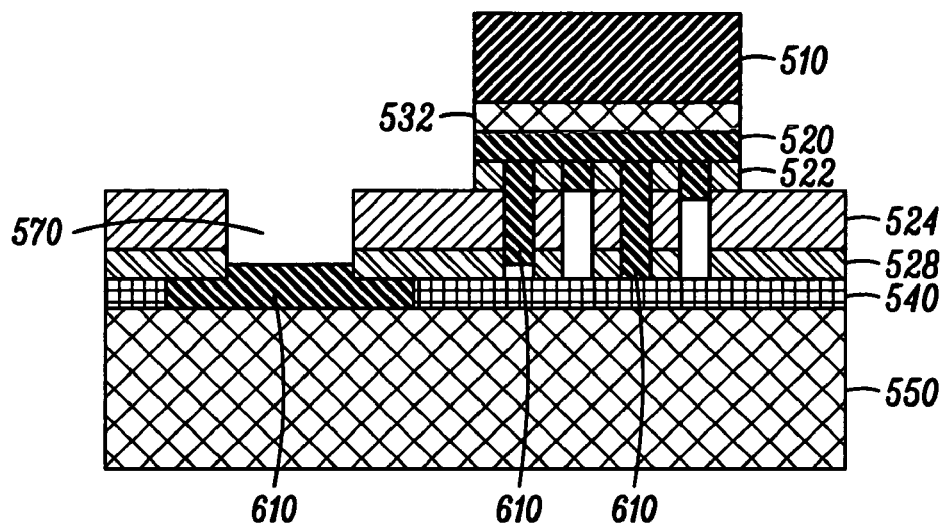
FIG. 7 illustrates a cross-sectional view at a section A—A of the electrical circuit apparatus illustrated in FIG. 5 subsequent to solder wetting.

FIG. 7 illustrates a cross-sectional view at a section A—A of the electrical circuit apparatus 400 illustrated in FIG. 5 subsequent to solder wetting. Those elements that are identical to the elements illustrated in FIG. 5 are correspondingly identically labeled in FIG. 7 and for the sake of brevity are not described again here. FIG. 7, however, further illustrates solder wetting 610 of solder 520 into at least a portion of the thermal apertures and of solder 560 from solder aperture 570 into an area between the ground layer 528 of the substrate 524 and the heat sink 550 for thermal coupling and grounding between the device ground terminal 532 and the heat sink 550 in an area that is not directly beneath the ground terminal of device 510.

Figure 8:
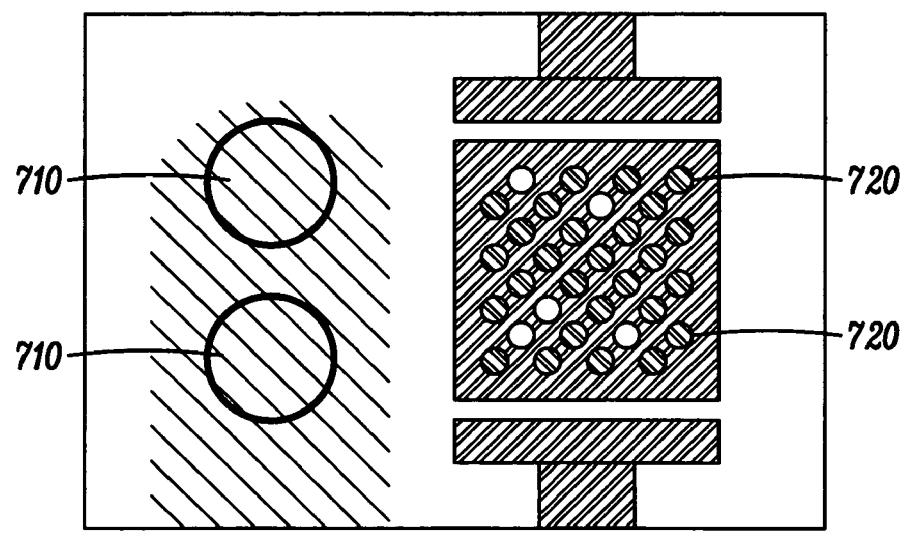
FIG. 8 illustrates an X-Ray image depiction of an assembled electrical circuit apparatus in accordance with embodiments of the present invention after device population and reflow soldering.

FIG. 8 illustrates an X-Ray image depiction of an assembled electrical circuit apparatus in accordance with the present invention after device population and reflow soldering. This X-Ray image depiction shows how solder has wetted from solder apertures 710 and within thermal apertures 720 to produce ideal solder connections between the ground layer of the substrate and the ground terminal of the device and between the ground layer of the substrate and the heat sink in an area that is not directly beneath the ground terminal of the device.

A number of exemplary advantages over the prior art can be realized using the method and electrical circuit apparatus of the present invention, wherein components may be mounted to a circuit board. These advantages include, but are not limited to: (1) minimization of thermal expansion mismatch problems by sufficiently mechanically decoupling a load resistor and a heat sink having different CTEs; (2) a good thermal path from the bottom of the component, though a plurality of thermal apertures, to a heat sink via the ground layer of the substrate; (3) repeatable solder attachment of the ground layer of the circuit board to the heat sink; (4) mechanical attachment of the heat sink to the circuit board to add robustness to assembly for handling and subsequent module assembly; (5) elimination of the need for fixtures in a one-step or single pass reflow soldering process that lends itself to no-lead solder or leaded solder; and (6) solder attachment for thermal management and for RF grounding can be accomplished during SMT attachment of other components to the circuit board without requiring additional process steps.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

What is claimed is:

1. A method for assembling an electrical circuit apparatus comprising a substrate having a top side, a ground layer, at least one thermal aperture, and at least one solder aperture, a heat sink, and an adhesive layer having at least one aperture, the method comprising the steps of:
   aligning the at least one substrate solder aperture with the at least one adhesive layer aperture;
   mechanically coupling the heat sink to the ground layer of the substrate using the adhesive layer such that none of the at least one substrate thermal aperture overlaps the at least one adhesive layer aperture;
   filling at least a portion of the at least one substrate solder aperture and at least a portion of the at least one substrate thermal aperture with solder; and
   performing a process for solder wetting, wherein the aligning of the at least one substrate solder aperture with the at least one adhesive layer aperture causes the solder to flow from the at least one substrate solder aperture to a predetermined area between the heat sink and the ground layer of the substrate.

2. The method of claim 1, wherein the electrical circuit apparatus further comprises a device having at least one input terminal and a ground terminal, and wherein the method further comprises a step, after the filling step, of mounting the device onto the topside of the substrate such that at least a portion of the device covers at least a portion of the at least one substrate thermal aperture and such that said device is coupled to the heat sink via at least a portion of the at least one substrate thermal aperture.

3. The method of claim 2, wherein the device is mounted such that none of the at least one adhesive aperture is beneath the ground terminal of the device.

4. The method of claim 3, wherein the device is coupled to the substrate and the solder wetting occurs during a single pass solder reflow process.

5. The method of claim 4, wherein the solder reflow process uses a no-lead solder.

6. The method of claim 4, wherein the solder reflow process uses a leaded solder.

7. The method of claim 2, wherein at least a portion of the steps of the method are performed as part of an automated process.

8. The method of claim 2, wherein at least a portion of the steps of the method are performed manually.

* * * * *